United States Patent
Charlebois et al.

(10) Patent No.: US 9,128,151 B1
(45) Date of Patent: Sep. 8, 2015

(54) PERFORMANCE SCREEN RING OSCILLATOR FORMED FROM PAIRED SCAN CHAINS

(71) Applicant: International Business Machines Corporation, Armonk, NY (US)

(72) Inventors: Margaret R. Charlebois, Jericho, VT (US); Christopher D. Hanudel, Essex Junction, VT (US); Robert D. Herzl, South Burlington, VT (US); David W. Milton, Underhill, VT (US); Clarence R. Ogilvie, Huntington, VT (US); Paul M. Schanely, Essex Junction, VT (US); Tad J. Wilder, South Hero, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/273,261

(22) Filed: May 8, 2014

(51) Int. Cl.
*G01R 31/3177* (2006.01)

(52) U.S. Cl.
CPC ................... *G01R 31/3177* (2013.01)

(58) Field of Classification Search
CPC ... G06F 11/1423; G06F 11/267; G06F 11/27; G01R 31/2815; G01R 31/3177; G01R 31/318533; G01R 31/318536; G01R 31/318541; G01R 31/3187
USPC .......................................................... 714/726
See application file for complete search history.

(56) References Cited

U.S. PATENT DOCUMENTS

| | | | |
|---|---|---|---|
| 3,665,396 A * | 5/1972 | Forney, Jr. ..................... | 714/789 |
| 5,592,493 A | 1/1997 | Crouch et al. | |
| 5,689,517 A | 11/1997 | Ruparel | |
| 6,158,032 A | 12/2000 | Currier et al. | |
| 6,219,813 B1 * | 4/2001 | Bishop et al. ................. | 714/736 |
| 6,388,533 B2 | 5/2002 | Swoboda | |
| 6,535,013 B2 | 3/2003 | Samaan | |
| 6,867,613 B1 | 3/2005 | Bienek | |
| 7,208,934 B2 | 4/2007 | King et al. | |
| 7,349,271 B2 | 3/2008 | Kuang et al. | |

(Continued)

FOREIGN PATENT DOCUMENTS

JP       2005003917 A      1/2005

OTHER PUBLICATIONS

Bickford, J.P.; Jinjun Xiong, "Use of performance path test to optimize yield," Advanced Semiconductor Manufacturing Conference (ASMC), 2013 24th Annual SEMI , vol., no., pp. 206,211, May 14-16, 2013.*

(Continued)

*Primary Examiner* — Cynthia Britt
(74) *Attorney, Agent, or Firm* — Anthony J. Canale; Hoffman Warnick LLC

(57) ABSTRACT

A performance screen ring oscillator (PSRO) formed from paired scan chains is disclosed. A circuit structure comprises scan chains each having scan chain elements. A scan chain link is configured to pair at least one scan chain element from a first scan chain with at least one scan chain element of a second scan chain to form a PSRO. A forward path associated with data flow through the at least one scan chain element of the first scan chain becomes a backward path of the at least one scan chain element of the second scan chain, and a forward path associated with data flow through the at least one scan chain element of the second scan chain becomes a backward path of the at least one scan chain element of the first scan chain.

20 Claims, 6 Drawing Sheets

(56) References Cited

U.S. PATENT DOCUMENTS

| | | | |
|---|---|---|---|
| 7,539,893 B1 | 5/2009 | Ferguson | |
| 7,550,987 B2 | 6/2009 | Acharyya et al. | |
| 7,609,542 B2 | 10/2009 | Adams et al. | |
| 7,620,510 B2 | 11/2009 | Carpenter et al. | |
| 7,835,176 B2 | 11/2010 | Adams et al. | |
| 7,958,417 B2* | 6/2011 | Chakraborty et al. | 714/726 |
| 8,154,309 B2 | 4/2012 | Agarwal et al. | |
| 8,214,699 B2 | 7/2012 | Arsovski et al. | |
| 2002/0129293 A1 | 9/2002 | Hutton et al. | |
| 2002/0199145 A1* | 12/2002 | Komoike | 714/729 |
| 2004/0098646 A1* | 5/2004 | Fisher | 714/726 |
| 2004/0190331 A1 | 9/2004 | Ross et al. | |
| 2005/0028060 A1* | 2/2005 | Dervisoglu et al. | 714/726 |
| 2006/0269038 A1 | 11/2006 | Jang et al. | |
| 2007/0089078 A1 | 4/2007 | Engel et al. | |
| 2007/0150780 A1 | 6/2007 | Shimooka | |
| 2007/0237012 A1 | 10/2007 | Kuang et al. | |
| 2008/0034337 A1 | 2/2008 | Kuemerle et al. | |
| 2008/0195337 A1 | 8/2008 | Agarwal et al. | |
| 2009/0113263 A1 | 4/2009 | Cannon et al. | |
| 2009/0210760 A1 | 8/2009 | Eckelman et al. | |
| 2009/0295402 A1 | 12/2009 | Balch et al. | |
| 2010/0042962 A1 | 2/2010 | Fazekas et al. | |
| 2010/0107024 A1 | 4/2010 | Tokunaga | |
| 2010/0188888 A1 | 7/2010 | Adams et al. | |
| 2010/0201418 A1 | 8/2010 | Delage et al. | |
| 2010/0264932 A1 | 10/2010 | Marinissen et al. | |
| 2010/0321042 A1 | 12/2010 | Agarwal et al. | |
| 2012/0233512 A1* | 9/2012 | Huang et al. | 714/729 |
| 2013/0125073 A1* | 5/2013 | Bickford et al. | 716/108 |
| 2013/0179742 A1 | 7/2013 | Tekumalla | |
| 2013/0285739 A1 | 10/2013 | Blaquiere et al. | |
| 2014/0132290 A1* | 5/2014 | Charlebois et al. | 324/750.01 |
| 2014/0298128 A1* | 10/2014 | Maliuk et al. | 714/731 |
| 2015/0032962 A1 | 1/2015 | Buyuktosunoglu et al. | |

OTHER PUBLICATIONS

Hawkins, Final Office Action Communication for U.S. Appl. No. 13/676,063 dated Oct. 24, 2014, (IBMB-0357), 20 pages.

Gabor et al., Improving the Power-Performance of Multicore Processors Through Optimization of Lithography and Thermal Processing, Oct. 13, 2010, Improved power-performance metrics, 7 pages.

IBM, "PSRO Yield and Model to Hardware Correlation Improvement for ASIC Arrays," Nov. 2008, 5 pages, IPCOM000176339D, An IP.com Prior Art Database Technical Disclosure.

Hawkins, Office Action Communication for U.S. Appl. No. 13/676,063 dated Sep. 3, 2014, (IBMB-0357), 26 pages.

U.S. Appl. No. 13/676,063, Office Action 2 dated Feb. 18, 2015, 27 pgs.

U.S. Appl. No. 14/273,247, Ex Parte Quayle Action dated May 7 2015, 26 pgs.

U.S. Appl. No. 14/273,247, Notice Of Allowance dated Jun. 2, 2015, 9 pages.

Notice of Allowance and Fee(s) Due for U.S. Appl. No. 13/676,063, dated Jul. 21, 2015, (29 pages).

\* cited by examiner

PERFORMANCE SCREEN RING OSCILLATOR FORMED FROM PAIRED SCAN CHAINS

CROSS REFERENCE TO RELATED APPLICATIONS

This patent application relates to commonly-assigned U.S. patent application Ser. No. 14/273,247 entitled "PERFORMANCE SCREEN RING OSCILLATOR FORMED FROM MULTI-DIMENSIONAL PAIRINGS OF SCAN CHAINS", filed concurrently with this application.

BACKGROUND

The disclosure relates generally to scan chains, and more particularly, to a performance screen ring oscillator (PSRO) formed from paired scan chains.

As the size of integrated circuits decrease, across chip variation (ACV) is becoming an increasing concern. A transistor on one side of an integrated circuit will not always operate similar to a transistor on another side of the integrated circuit. Margins are provided in order to ensure that the integrated circuit operates as desired, however, this can lead to reduced performance and increased power requirements.

It is helpful to understand how an integrated circuit will behave, in order to minimize these margins. Performance screen ring oscillators (PSROs) can be used to monitor and predict performance in areas of an integrated circuit. A PSRO is usually used in close proximity to the area that is being monitored. Typically, a large number of PSROs are needed in order to monitor many areas of an integrated circuit. However, current PSROs can take up significant space and wiring, which may make them less appealing for use in monitoring and predicting performance of areas in an integrated circuit.

SUMMARY

In one embodiment, there is a circuit structure comprising: a plurality of scan chains each having a plurality of scan chain elements configured to operate as a shift register in a test mode while an integrated circuit undergoes a test mode of operation, and obtain functional data from circuitry in the integrated circuit during a functional mode of operation; and a scan chain link configured to pair at least one scan chain element from a first scan chain with at least one scan chain element of a second scan chain to form a performance screen ring oscillator (PSRO), wherein the PSRO formed by the scan chain link pairing the at least one scan chain element from the first scan chain with the at least one scan chain element of the second scan chain causes a forward path associated with data flow through the at least one scan chain element of the first scan chain to act as a backward path for data flow through the at least one scan chain element of the second scan chain, and a forward path associated with data flow through the at least one scan chain element of the second scan chain to act as a backward path for data flow through the at least one scan chain element of the first scan chain.

In another embodiment, there is a method comprising: configuring a scan chain link between a first scan chain having a plurality of scan chain elements and a second scan chain having a plurality of scan chain elements; and configuring the scan chain link to pair at least one scan chain element from the first scan chain with at least one scan chain element of the second scan chain via the scan chain link to form a performance screen ring oscillator (PSRO), wherein the PSRO formed by the scan chain link pairing the at least one scan chain element from the first scan chain with the at least one scan chain element of the second scan chain causes a forward path associated with data flow through the at least one scan chain element of the first scan chain to act as a backward path for data flow through the at least one scan chain element of the second scan chain, and a forward path associated with data flow through the at least one scan chain element of the second scan chain to act as a backward path for data flow through the at least one scan chain element of the first scan chain.

DETAILED DESCRIPTION

Figure 1:
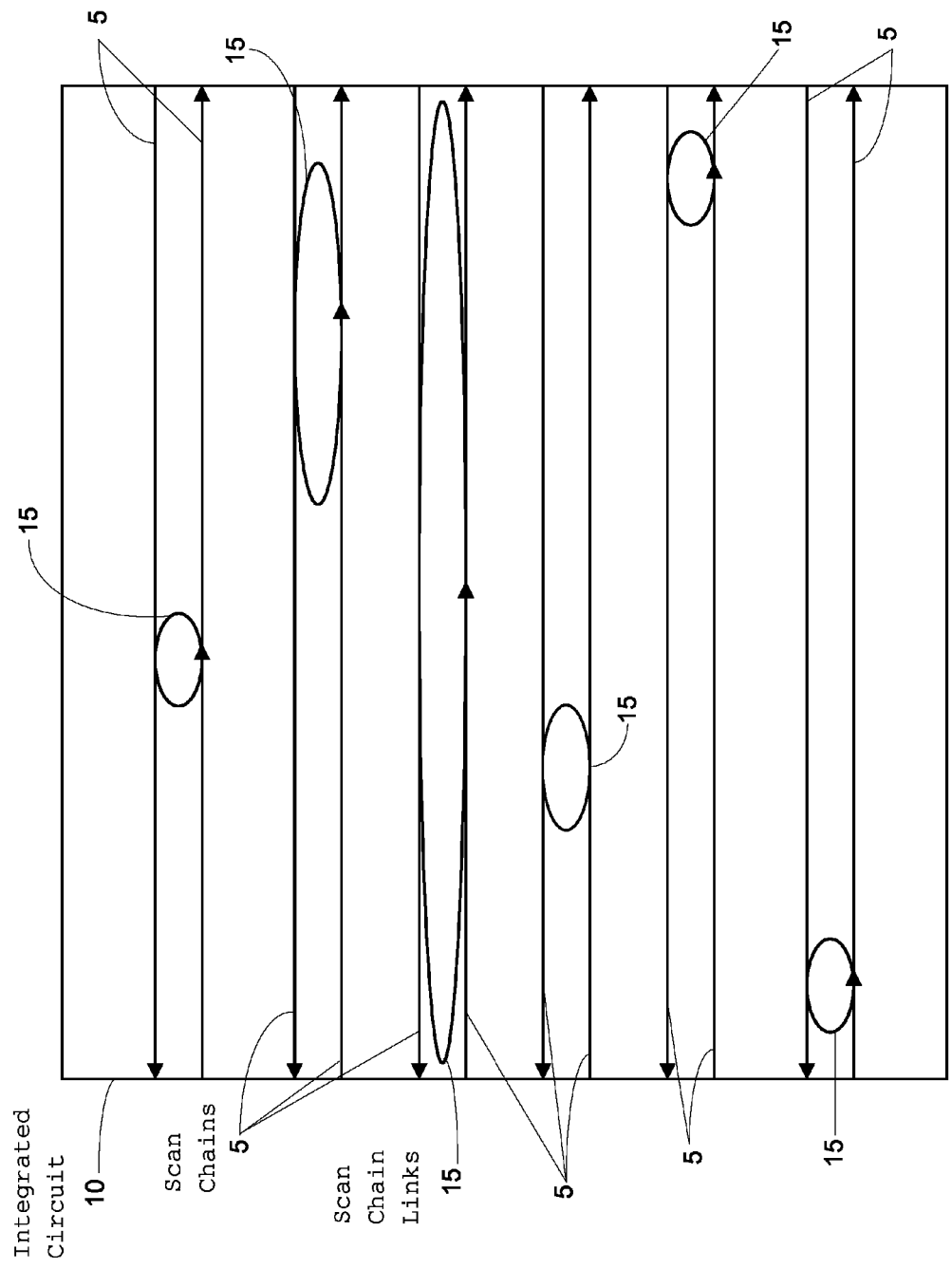
FIG. 1 is a schematic diagram illustrating the pairing of scan chains in an integrated circuit to form performance screen ring oscillators (PSROs) according to an embodiment of the invention.

Referring now to the drawings, FIG. 1 is a schematic diagram showing scan chains 5 in an integrated circuit 10 that can be paired by a scan chain link 15 to form oscillating loops that can result in a performance screen ring oscillator (PSRO) according to an embodiment of the invention. Although not shown in FIG. 1, each scan chain 5 can have multiple scan chain elements or cells that can be implemented by, for example, flip flops or latches. The scan chain elements in each scan chain 5 can be configured to form a shift register for applying test patterns to inputs of combinational logic in integrated circuit 10 and reading outputs from the combinational logic based on the inputted test patterns. In a test mode, which includes scan operations and a functional clock, the scan chain elements can be used to apply and read the test patterns at the control of the functional clock. During a functional mode, the scan operation is disabled, allowing the combinational logic in the integrated circuit to operate in its intended manner.

For clarity, integrated circuit 10 is not illustrated with combinational logic. Those skilled in the art will appreciate that integrated circuit 10 would include circuitry that embodies the combinational logic as well as scan test circuitry that includes scan chains 5 and scan chain links 15.

Each scan chain 5 illustrated in FIG. 1 is denoted with an arrow representing a forward path in which data flows in the scan chain. As shown in FIG. 1, the forward paths of scan chains 5 can have an alternating pattern in which the direction of the forward path of each scan chain is in a direction that is opposite its neighboring scan chains. The direction pattern of the forward paths of scan chains 5 in FIG. 1 is only one example, and those skilled in the art will appreciate that embodiments of the invention are suitable for use with other possible patterns. For example, the forward paths of scan chains 5 having a common direction can be arranged in an even or an odd numbered pattern. In another embodiment, the forward paths of scan chains 5 having a common direction can be arranged in a non-contiguous pattern.

As explained below in more detail, scan chain link 15 is configured to pair at least one scan chain element from a scan chain 5 with at least one scan chain element of another scan chain 5 to form a PSRO. In this manner, a forward path associated with the data flow through the scan chain element of a first scan chain becomes a backward path of the scan chain element of a second scan chain. Similarly, a forward path associated with the data flow through the scan chain element of the second scan chain becomes a backward path of the scan chain element of the first scan chain.

FIG. 1 illustrates that the size of scan chain links 15 can vary. In this manner, scan chain links 15 can be configured to form any sized PSRO having a given length by pairing a desired number of scan chain elements from opposing scan chains 5.

FIG. 1 illustrates the pairing of adjacent opposing scan chains for sake of clarity, however, embodiments of the invention are suitable for pairing scan chains that extend beyond opposing scan chains that are immediate neighbors (i.e., non-contiguous). For example, opposing scan chains that are co-located with each other in the scan circuitry in integrated circuit 10 can be paired together. Those skilled in the art will appreciate that the pairing of scan chains having opposing forward paths will depend on their proximity and ease in which connections can be made between the scan chains.

Figure 2:
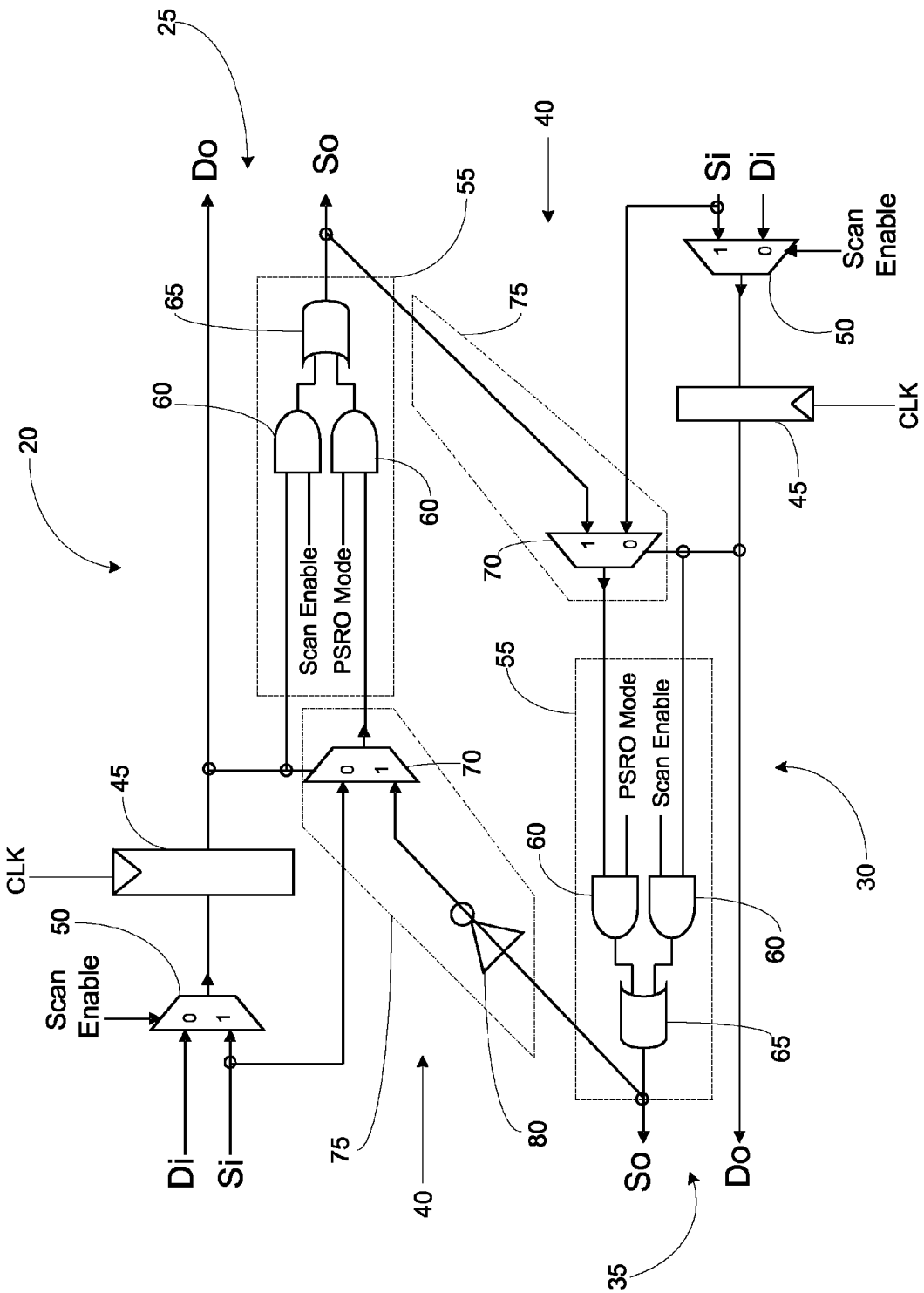
FIG. 2 is a schematic circuit diagram illustrating the pairing of a scan chain element in a first scan chain with a scan chain element in a second scan chain to form a PSRO that oscillates in one or more test modes of operation according to an embodiment of the invention.

FIG. 2 is a schematic circuit diagram illustrating the pairing of a scan chain element 20 in a first scan chain 25 with a scan chain element 30 in a second scan chain 35 to form a PSRO 40 that can oscillate in a one or more test modes of operation of an integrated circuit that includes scan operations and a functional clock. Scan chain element 20 and scan chain element 30 each includes a latch 45 controlled by a clock signal CLK. An example of a latch that can be used in scan chain element 20 and scan chain element 30 includes a flip flop. A multiplexer 50 provides data to an input of each latch 45. In one embodiment, multiplexer 50 can include two selectable inputs and a control input to select between the inputs. The selectable inputs can include a data input (Di) and a scan input (Si), and the control input can include a scan enable input (Scan Enable). In operation, when Scan Enable is at a logic "high" level ("1") and scan chains 25 and 35 are in a test mode of operation, multiplexer 50 selects scan input $S_i$ for application to the data input of latch 45. Alternatively, when Scan Enable is at a logic "low" level ("0") and scan chains 25 and 35 are in a functional mode of operation, multiplexer 50 selects data input Di for application to the data input of latch 45.

Scan chain elements 20 and 30 each includes scan output circuitry 55 coupled to the data output of latch 45. Each scan output circuitry 55 is configured to shift data from latch 45 in the direction of the forward path of each scan chain to a latch of a scan chain element that follows scan chain elements 20 and 30. In FIG. 2, the forward path of scan chains 25 and 35 is illustrated by the direction that data including data input Di and scan input Si moves from scan chain element 20 and scan chain element 30, respectively, to a data output Do and a scan output So, respectively.

As shown in FIG. 2, scan output circuitry 55 can comprise two two-input AND gates 60 and a two-input OR gate 65. One AND gate 60 can receive the Scan Enable signal and an output from the latch 45, while the other AND gate 60 can receive a PSRO mode enable signal (PSRO Mode) and an output from a multiplexer 70 in a scan chain link 75. Each AND gate 60 generates an output that is provided to OR gate 65 which outputs scan output So.

Scan chain link 75 can be configured to pair scan chain element 20 from scan chain 25 with scan chain element 30 of scan chain 35 to form PSRO 40. In one embodiment, scan chain link 75 can include scan output control circuitry that is configured to control operation of the scan output circuitry 55 of scan chain element 20 and 30. Controlling the operation of the scan output circuitry 55 enables scan chain link 75 to pair scan chain element 20 with scan chain element 30 to form a PSRO. For sake of clarity, scan chain link 75 is illustrated in FIG. 2 as separate components, however, those skilled in the art will appreciate that scan chain link 75 could be one component for adjacent scan chains or as a component that is separate from the scan chains and configurable to be implemented as desired to create oscillating loops of any scan chains used in test scan circuitry.

As shown in FIG. 2, the scan output control circuitry can include two multiplexers 70 that pair scan chain element 20 with scan chain element 30. Each multiplexer 70 can include two selectable inputs and a control input to select between the inputs. The selectable inputs can include a scan input $S_i$ provided to scan chain elements 20 and 30 in scan chains 25 and 30, respectively, while the control input can include an output from latch 45 in the scan chain elements. The control input for multiplexer 70 in scan chain 25 receives the output of latch 45 in scan chain element 20, while the control input for multiplexer 70 in scan chain 35 receives the output of latch 45 in scan chain element 30.

In operation, when Scan Enable is at a logic low level and PSRO Mode is at a logic high level, the output of latch 45 in scan chain element 20 causes multiplexer 70 in scan chain link 75 that operates in conjunction with scan chain 25 to select the scan output So from scan chain element 30 in scan chain 35 as inverted by an inverter 80. Similarly, when Scan Enable is at a logic low level and PSRO Mode is at a logic high level, the output of latch 45 in scan chain element 30 causes multiplexer 70 in scan chain link 75 that operates in conjunction with scan chain 35 to select the scan output $S_o$ from scan chain element 20 in scan chain 25. In this manner, a forward path associated with the data flow through scan chain element 20 of scan chain 25 becomes a backward path of scan chain element 30 of scan chain 35. Similarly, a forward path associated with the data flow through scan chain element 30 of the scan chain 35 becomes a backward path of scan chain element 20 of the scan chain 25. As a result, the paired scan chain elements of scan chains 25 and 35 can operate as a PSRO that oscillates during one or more test modes of operation of an integrated circuit.

In order to facilitate the scan chain link 75 configuring a PSRO with oscillating loops when Scan Enable is at a logic low level and PSRO Mode is at a logic high level, the scan chains 25 and 35 can be preconditioned. In one embodiment, a logic high ("1") can be scanned in the starting and ending scan chain elements that are desired to form the PSRO, while a logic low ("0") can be scanned in all other scan chain elements of the scan chains. In general, a value is scanned down a scan chain with Scan Enable at "1" followed by dropping it back to "0". To run the PSRO, Scan Enable has to be brought back to "0", otherwise the So output will be distorted by outputs of the scan elements. U.S. patent application Ser. No. 13/676,063 entitled "FLEXIBLE PERFORMANCE SCREEN RING OSCILLATOR WITHIN A SCAN CHAIN" filed Nov. 13, 2012, provides further details on preconditioning scan chains for running a PSRO. Those skilled in the art will appreciate that such preconditioning of scan chain elements is useful when control of multiplexer 70 comes from the output of the scan chain element itself as illustrated in FIG. 2.

In addition to the PSRO mode of operation, the configuration of FIG. 2 also allows for other modes of operation such as one or more test modes of operation including the scan operations, and the functional mode of operation. For example, when only in a test mode with scan operation, Scan Enable is at a logic high level, then scan chain elements 20 and 30 can each receive scan input Si and shift out scan output So to a following scan chain element in scan chain 25 and 35, respectively. When in a functional mode, Scan Enable is at a logic low level, then scan chain elements 20 and 30 can receive data input Di and feed functional logic or cones (not shown) out data output Do.

Figure 3:
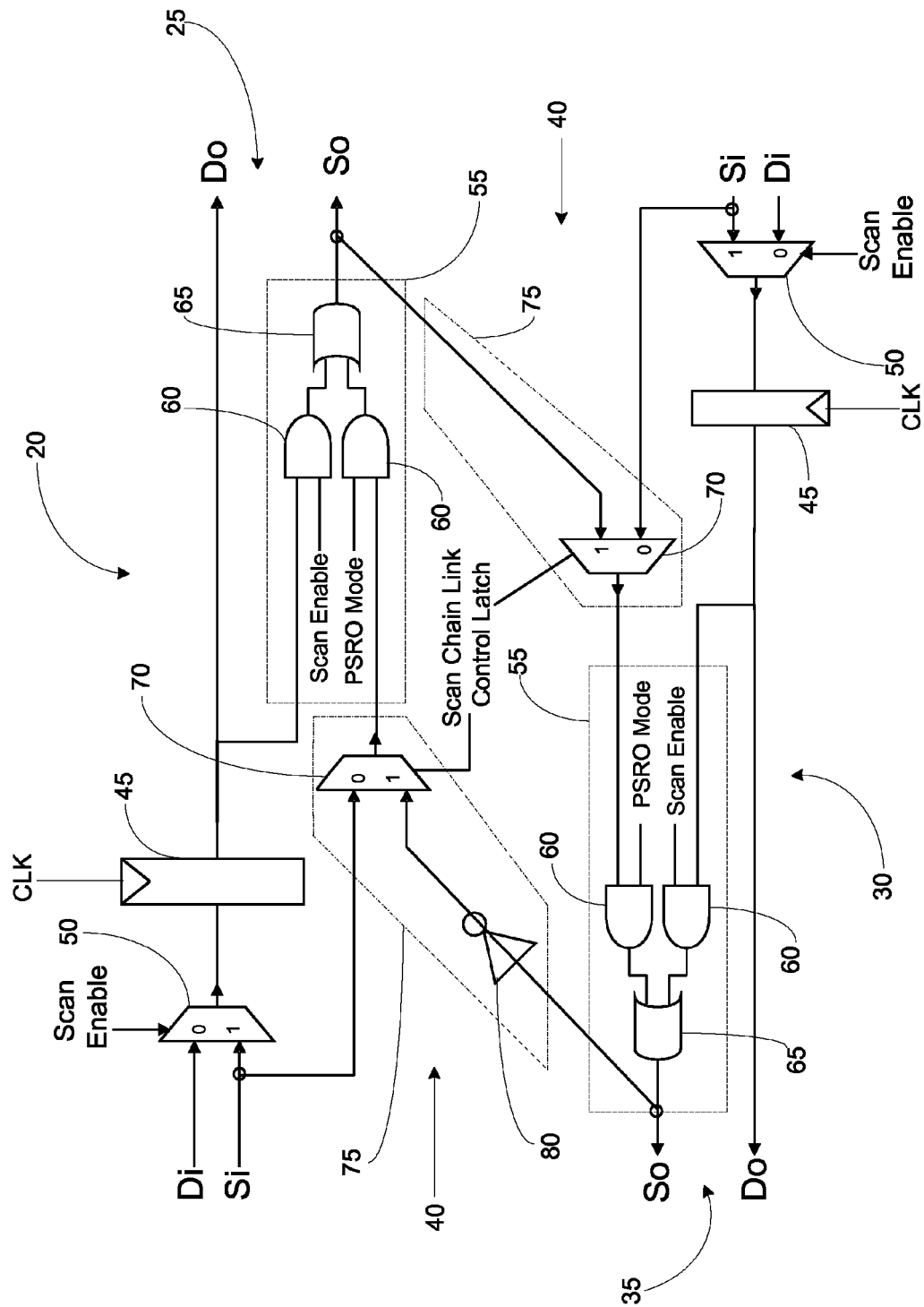
FIG. 3 is a schematic circuit diagram illustrating the pairing of a scan chain element in a first scan chain with a scan chain element in a second scan chain to form a PSRO that oscillates in one or more test modes of operation and a functional mode of operation according to an embodiment of the invention.

FIG. 3 is a schematic circuit diagram illustrating the pairing of a scan chain element 20 in a first scan chain 25 with a scan chain element 30 in a second scan chain 35 to form a PSRO 40 that can oscillate in one or more test modes of operation that each includes a scan operation and a functional clock, and a functional mode of operation of an integrated circuit. The embodiment illustrated in FIG. 3 differs from FIG. 2 in that the control input for multiplexers 70 of the scan output control circuitry that pair scan chain element 20 with scan chain element 30 is not provided by latches 45. Instead, the control input for multiplexers 70 is from data output from another latch that is not in scan chain elements 20 and 30. As used herein, this other latch is referred to as a scan chain link control latch since it provides the controlling input to multiplexers 70 that controls the functioning of scan chain link 75. The scan chain link control latch can be a specially designated latch in scan circuitry that can be used by scan chain link 75 to pair certain scan chain elements of a scan chain with scan chain elements in another scan chain. Examples of latches that can be used as the scan chain link control latch can include scan only latches, L3 latches and spare functional latches.

The operation of the embodiment illustrated in FIG. 3 is similar to FIG. 2, except that the use of the scan chain link control latch enables the paired scan chains 25 and 35 to operate as a PSRO and oscillate during one or more test modes of operation and a functional mode of operation. For example, if the PSRO Mode is at a logic high level during a test mode of operation while Scan Enable is at a logic low level, and the output of the scan chain link control latch is at a logic high level, then multiplexer 70 in scan chain link 75 that operates in conjunction with scan chain 25 will select the scan output So from scan chain element 30 in scan chain 35 as inverted by an inverter 80. Similarly, PSRO Mode at a logic high level along with Scan Enable at a logic low level, and scan chain link control latch at a logic high level will cause multiplexer 70 in scan chain link 75 that operates in conjunction with scan chain 35 to select the scan output So from scan chain element 20 in scan chain 25.

In this manner, a forward path associated with the data flow through scan chain element 20 of scan chain 25 becomes a backward path of scan chain element 30 of scan chain 35. Similarly, a forward path associated with the data flow through scan chain element 30 of the scan chain 35 becomes a backward path of scan chain element 20 of the scan chain 25. As a result, the paired scan chain elements in scan chains 25 and 35 can operate as a PSRO that oscillates during one or more test modes of operation of an integrated circuit.

If the PSRO Mode is at a logic high level during a functional mode of operation and the output of the scan chain link control latch is at a logic high level, then multiplexer 70 in scan chain link 75 that operates in conjunction with scan chain 25 will select the scan output $S_o$ which connects with the data output Do from scan chain element 30 in scan chain 35, as inverted by an inverter 80. Similarly, PSRO Mode at a logic high level along with Scan Enable at a logic low level and scan chain link control latch at a logic high level will cause multiplexer 70 in scan chain link 75 that operates in conjunction with scan chain 35 to select the scan output So which connects with the data output Do from scan chain element 20 in scan chain 25.

In this manner, a forward path associated with the data flow through scan chain element 20 of scan chain 25 becomes a backward path of scan chain element 30 of scan chain 35. Similarly, a forward path associated with the data flow through scan chain element 30 of the scan chain 35 becomes a backward path of scan chain element 20 of the scan chain 25. As a result, the paired scan chain elements of scan chains 25 and 35 can operate as a PSRO that oscillates during the functional mode of operation of an integrated circuit.

Figure 4:
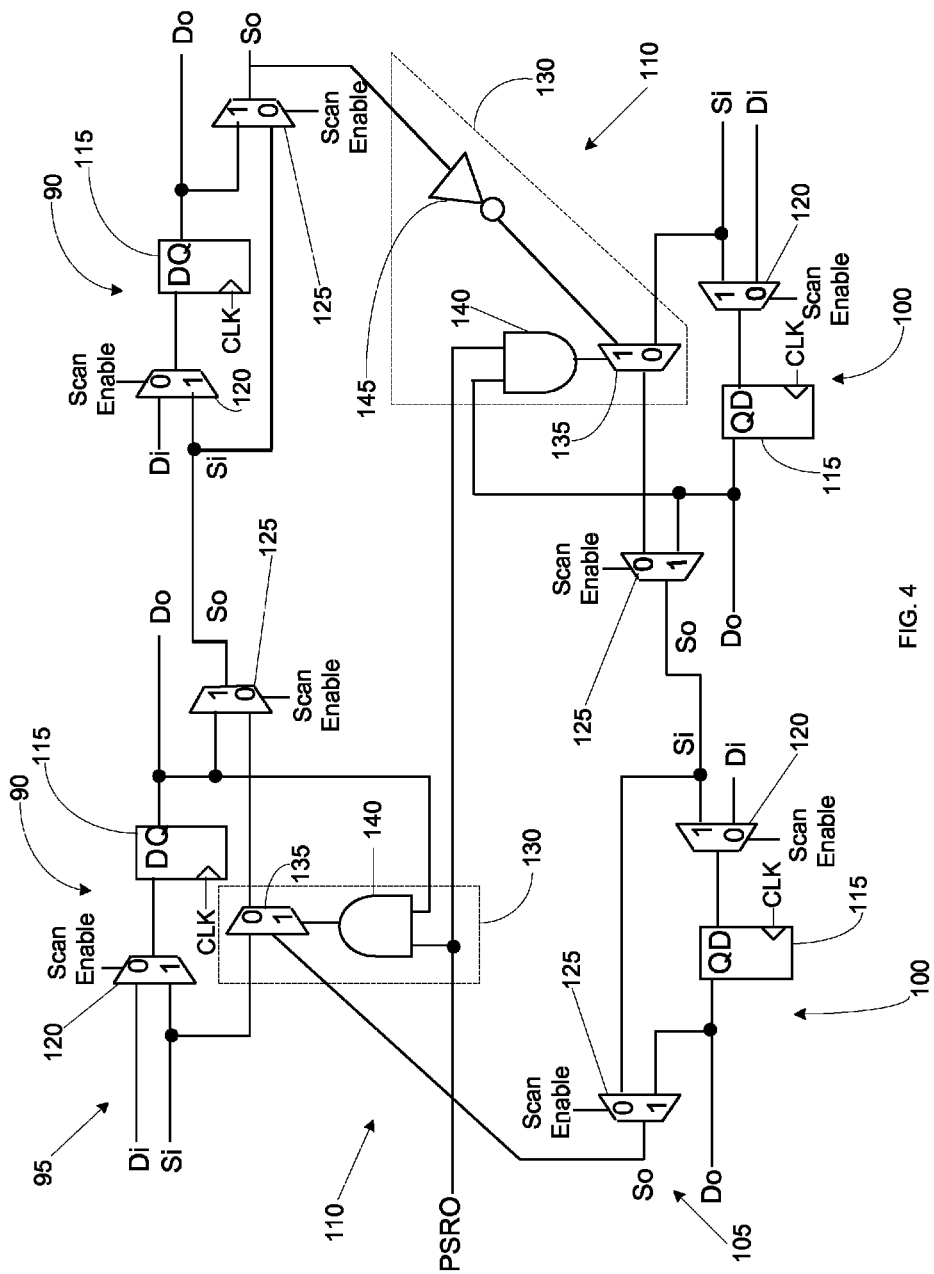
FIG. 4 is a schematic circuit diagram illustrating the pairing of more than one scan chain element in a first scan chain with more than one scan chain element in a second scan chain to form a PSRO that oscillates in only one or more test modes of operation according to an embodiment of the invention.

FIG. 4 is a schematic circuit diagram illustrating the pairing of more than one scan chain element in a first scan chain with more than one scan chain element in a second scan chain to form a PSRO that oscillates in one or more test modes of operation of an integrated circuit according to an embodiment of the invention. The schematic circuit diagram of FIG. 4 illustrates the pairing of scan chain elements 90 in a first scan chain 95 with scan chain elements 100 in a second scan chain 105 to form a PSRO 110 that oscillates in one or more test modes of operation of an integrated circuit. Scan chain elements 90 and scan chain elements 100 each includes a latch 115 controlled by a clock signal CLK. An example of a latch that can be used in scan chain elements 90 and scan chain elements 100 includes a flip flop. In FIG. 4, latch 115 takes the form of a gated D flip flop.

A multiplexer 120 provides data to an input of each latch 115. In one embodiment, multiplexer 120 can include two selectable inputs and a control input to select between the inputs. The selectable inputs can include a data input (Di) and a scan input (Si), and the control input can include a scan enable input (Scan Enable). In operation, when Scan Enable is at a logic high level and scan chains 95 and 105 are in a test mode of operation, each multiplexer 120 selects scan input $S_i$ for application to the data input of latch 115. Alternatively, when Scan Enable is at a logic low level and scan chains 95 and 105 are in a functional mode of operation, each multiplexer 120 selects data input Di for application to the data input of latch 115.

Scan chain elements 90 and 100 include a scan output multiplexer 125 coupled to the data output of latch 115 in its respective scan chain element. Each scan output multiplexer 125 is configured to shift data from latch 115 in the direction of the forward path of each scan chain to a latch of a scan chain element that follows scan chain elements 90 and 100. In FIG. 4, data shifts through scan chain elements 90 in scan chain 95 in a left-to-right direction, while data shifts through scan chain elements 100 in scan chain 105 in a right-to-left direction.

As shown in FIG. 4, each scan output multiplexer 125 has a first selectable input that receives the data output from latch 115 in its respective scan chain element, a second selectable input that receives a scan data input provided to the scan chain element, and a control input configured to receive the Scan Enable signal.

A scan chain link 130 can be configured to pair scan chain elements 90 from scan chain 95 with scan chain elements 100 of scan chain 105 to form PSRO 110. As shown in FIG. 4, scan chain link 130 can include multiplexers 135. Each multiplexer 135 can include having a first selectable input that receives a scan data output from a scan chain element in another scan chain, a second selectable input that receives a scan data input provided to a scan chain element 90 and 100 in scan chain 95 and 105, respectively, and a control input configured to receive the PSRO mode enable signal. For example, the first selectable input for multiplexer 135 in the left-most scan chain element 90 in scan chain 95 can include scan data output $S_o$ from a scan chain element 100 in scan chain 105, a second selectable input can include a scan data input Si provide to the left-most scan chain element 90 in scan chain 95, and the control input can receive the PSRO mode enable signal. In another example, the first selectable input for multiplexer 135 in the right-most scan chain element 100 in scan chain 105 can include scan data output So from a scan chain element 90 in scan chain 95, a second selectable input can include a scan data input Si provided to the right-most scan chain element 100 in scan chain 105, and the control input can receive the PSRO mode enable signal.

As shown in FIG. 4, scan chain link 130 can further include at least two two-input AND gates 140. Each AND gate 140 is coupled to a multiplexer 135 to provide the control input. A first input of each AND gate 140 is configured to receive the PSRO mode enable signal, and a second input of each input AND gate is configured to receive scan data output $D_o$ from a latch 115 in a scan chain.

Scan chain link 130 as shown in FIG. 4 can also include an inverter 145 coupled between a multiplexer 135 that couples the scan output So from one scan chain to another scan chain. As shown in FIG. 4, inverter 145 inverts the scan output So from the right-most scan chain element 90 in scan chain 95 that is used as one of the selectable inputs provided to multiplexer 135 in scan chain 105.

In operation, when Scan Enable is at a logic low level and PSRO Mode is at a logic high level, the output of latch 115 in the right-most scan chain element 90 causes the right-most multiplexer 135 in scan chain 105 to select the scan output So from the right-most scan chain element 90 in scan chain 95 as inverted by an inverter 145. Similarly, when Scan Enable is at a logic low level and PSRO Mode is at a logic high level, the output of latch 115 in the left-most scan chain element 100 causes the left-most multiplexer 135 in scan chain 95 to select the scan output So from the left-most scan chain element 100 in scan chain 105.

In this manner, a forward path associated with the data flow through scan chain elements 100 of scan chain 105 forms a backward path of scan chain elements 90 for scan chain 95. Similarly, a forward path associated with the data flow through scan chain elements 90 of the scan chain 95 forms a backward path of scan chain elements 100 for the scan chain 105. As a result, the paired scan chain elements in scan chains 95 and 105 can operate as a PSRO that oscillates during one or more test modes of operation of an integrated circuit.

In addition to the PSRO mode of operation, the configuration of FIG. 4 also allows for other modes of operation such as one or more test modes of operation and the functional mode of operation. For example, when Scan Enable is at a logic high level, then scan chain elements 90 and 100 can each receive scan input Si and shift out scan output So to a following scan chain element in scan chains 95 and 105, respectively. When Scan Enable is at a logic low level, then scan chain elements 90 and 100 can operate in the functional mode and receive data input Di and feed functional logic or cones (not shown) out data output Do.

Figure 5:
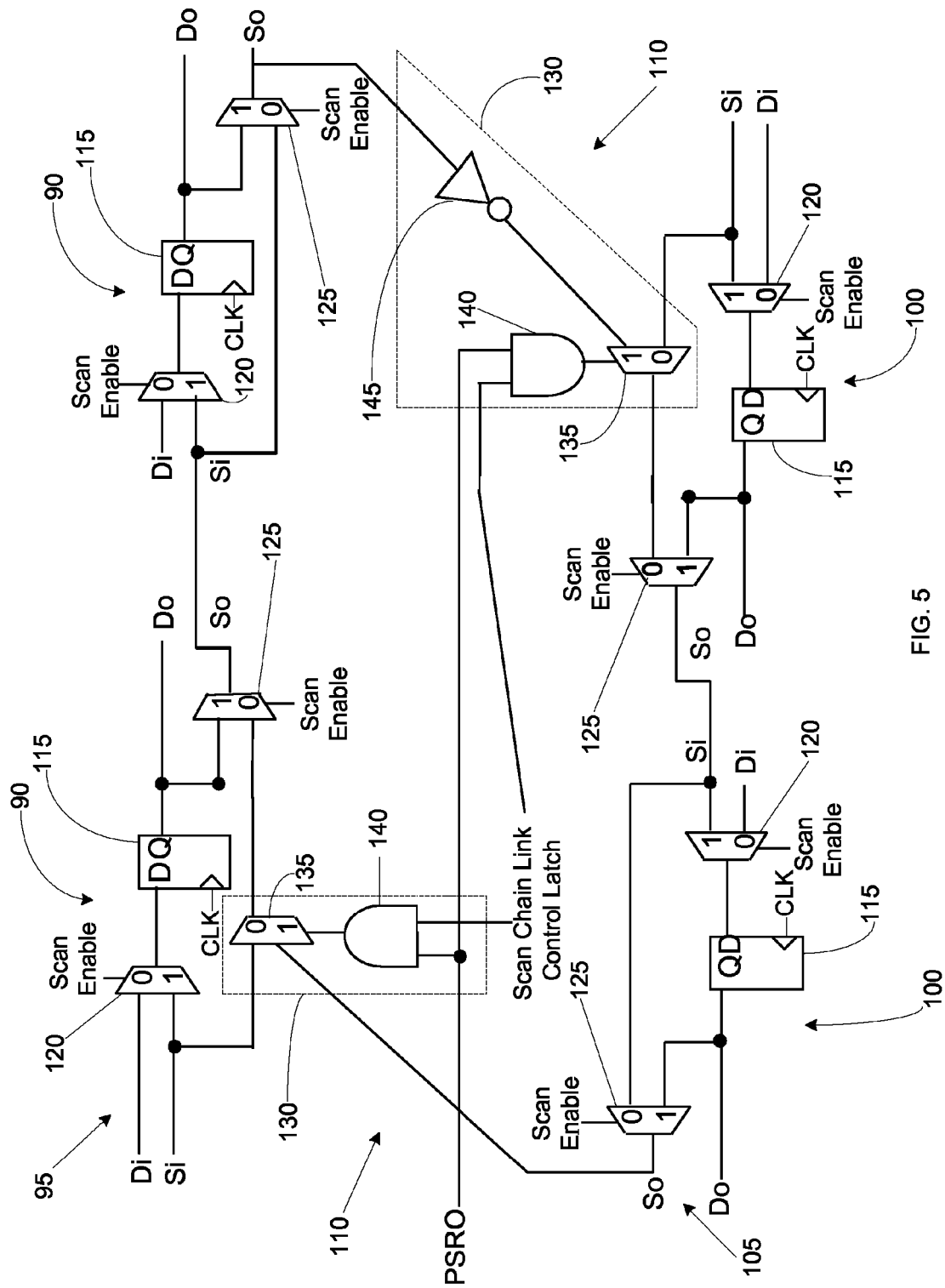
FIG. 5 is a schematic circuit diagram illustrating the pairing of more than one scan chain element in a first scan chain with more than one scan chain element in a second scan chain to form a PSRO that oscillates in one or more test modes of operation and a functional mode of operation in an integrated circuit according to an embodiment of the invention.

FIG. 5 is a schematic circuit diagram illustrating the pairing of more than one scan chain element 90 in a scan chain 95 with more than one scan chain element 100 in scan chain 105 to form a PSRO 110 that can oscillate in one or more test modes of operation and a functional mode of operation of an integrated circuit. The embodiment illustrated in FIG. 5 differs from FIG. 4 in that the control input for multiplexers 135 that is provided by AND gates 140 is not a function of the data output $D_o$ generated from a latch 115 in the scan chain elements 90 and 100 in scan chains 95 and 105, respectively. Instead, the control input for multiplexers 135 that is provided by AND gates 140 is a function of the data output generated from another latch that is not in scan chain elements 90 and 100. Again, this other latch can be referred to as a scan chain link control latch since it has a role in providing the controlling input to multiplexers 135 that controls the functioning of scan chain link 130.

The operation of the embodiment illustrated in FIG. 5 is similar to FIG. 4, except that the use of the scan chain link control latch enables the scan chain elements of the paired scan chains 95 and 105 to operate as a PSRO and oscillate during one or more test modes of operation and a functional mode of operation. For example, if the PSRO Mode is at a logic high level during a test mode of operation, while Scan Enable is at a logic low level, and the output of the scan chain link control latch is at a logic high level, then multiplexer 135 in scan chain link 133 that operates in conjunction with scan chain 95 will select the scan output $S_o$ from left-most scan chain element 100 in scan chain 105. Similarly, PSRO Mode at a logic high level along with Scan Enable at a logic low level, and the scan chain link control latch at a logic high level will cause multiplexer 135 in scan chain link 133 that operates in conjunction with scan chain 105 to select the scan output $S_o$ from right-most scan chain element 90 in scan chain 95 as inverted by an inverter 145.

In this manner, a forward path associated with the data flow through scan chain elements 100 of scan chain 105 becomes a backward path for scan chain elements 90 of scan chain 95. Similarly, a forward path associated with the data flow through scan chain elements 90 of the scan chain 95 becomes a backward path for scan chain elements 100 of the scan chain 105. As a result, the paired scan chain elements of scan chains 95 and 105 can operate as a PSRO that oscillates during the test mode of operation of an integrated circuit.

If the PSRO Mode is at a logic high level during a functional mode of operation (i.e., Scan Enable is at a logic low level) and the output of the scan chain link control latch is at a logic high level, then multiplexer 135 in scan chain 95 will select the scan output So from left-most scan chain element 100 in scan chain 105. Similarly, PSRO Mode at a logic high level along with Scan Enable at a logic low level and scan chain link control latch at a logic high level will cause multiplexer 135 in scan chain 105 to select the scan output So from right-most scan chain element 90 in scan chain 95 as inverted by an inverter 145.

In this manner, a forward path associated with the data flow through scan chain elements 100 of scan chain 105 becomes a backward path of scan chain elements 90 of scan chain 95. Similarly, a forward path associated with the data flow through scan chain elements 90 of the scan chain 95 becomes a backward path of scan chain elements 100 of the scan chain 105. As a result, the paired scan chain elements of scan chains 95 and 105 can operate as a PSRO that oscillates during the functional mode of operation of an integrated circuit.

Figure 6:
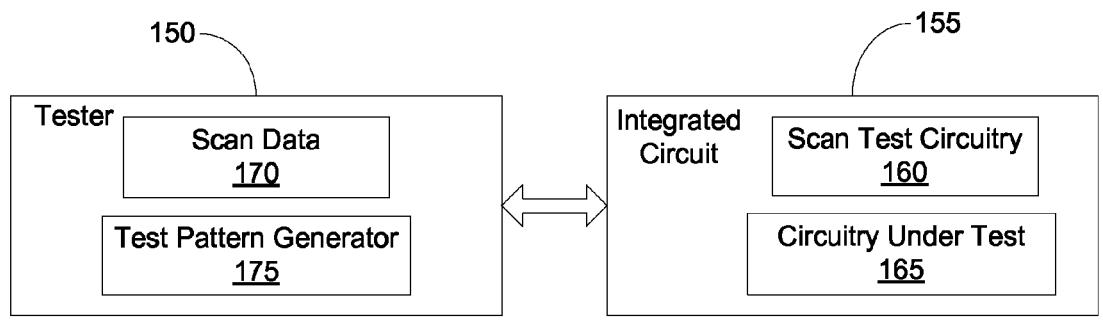
FIG. 6 is a schematic block diagram illustrating an integrated circuit tester in use with an integrated circuit that can have circuit structures depicted in FIGS. 1-5 according to an embodiment of the invention.

FIG. 6 is a schematic block diagram illustrating an integrated circuit tester 150 in use with an integrated circuit 155 that can have circuit structures depicted in FIGS. 1-5 according to an embodiment of the invention. In FIG. 6, tester 150 can be used to test integrated circuit 155 in one of any number of well known approaches. Integrated circuit 155 can include scan test circuitry 160 coupled to additional internal circuitry 165 that is subject to testing utilizing scan test circuitry that can include any of the circuit structures depicted in FIGS. 1-5. In one embodiment tester 150 can store scan data 170 associated with scan testing of the integrated circuit. Such scan data may correspond to test patterns provided by a test pattern generator 175. In other embodiments, at least a portion of the tester 150, such as the test pattern generator 175, may be incorporated into the integrated circuit 155. In another embodiment, tester 150 may be incorporated into the integrated circuit 155 as in, for example, a built-in self-test (BIST) arrangement.

The tester 150 in the testing system of FIG. 6 need not take any particular form, and various conventional testing system arrangements can be modified in a straightforward manner to support the various circuit structures depicted in FIGS. 1-5. For example, tester 150 can comprise a load board in which an integrated circuit subject to scan testing is installed in a portion of the load board. Tester 150 can also comprise processor and memory elements for executing stored program code. In one embodiment, the processor can implement a test pattern generator 175. Associated scan data 170 can be stored in memory. Those skilled in the art will appreciate that numerous alternative testers may be used to perform scan testing of an integrated circuit using the various circuit structures disclosed herein. For example, as indicated above, in an alternative embodiment, at least portions of the tester 150 may be incorporated into the integrated circuit itself, as in a BIST arrangement.

Figure 7:
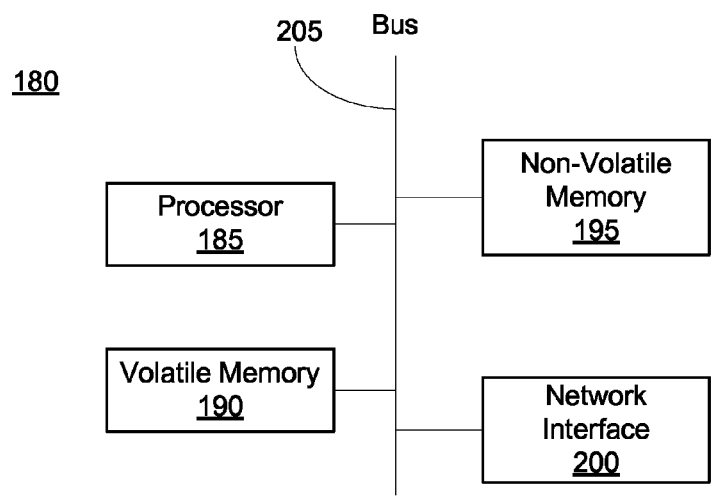
FIG. 7 is a schematic diagram of a computing environment that may be used to generate an integrated circuit design that can have circuit structures depicted in FIGS. 1-5 according to an embodiment of the invention.

The insertion of circuit structures in scan chains like those described for FIGS. 1-5 in scan test circuitry 160 of a given integrated circuit design may be performed in a computing environment 180 of the type shown in FIG. 7. Such a computing environment 180 can comprise a design system configured for use in designing integrated circuits such as integrated circuit 155 to include scan test circuitry 160 having scan chains and the circuit structures described herein that can generate a PSRO from pairing scan chain elements in different scan chains during one or more test modes of operation and a functional mode of operation.

Computing environment 180 can comprise a processor 185 coupled to a volatile memory 190 (e.g., RAM), and a nonvolatile memory 195 (e.g., ROM). A network interface 200 can be coupled to processor 185, memory 190 and memory 195 via a data bus 205 for permitting communication with other systems and devices over one or more networks. Processor 185 can implement a scan module for supplementing core designs with scan chain elements and circuit structures disclosed herein, in conjunction with integrated circuit design software.

A scan module, core designs, scan chain elements, and integrated circuit design software can be implemented at least in part in the form of software stored in memory 190 and 195 and processed by processor 185. For example, the memory 190 and 195 may store program code that is executed by the processor 185 to implement particular circuit structures described herein within an overall integrated circuit design process. Memory 190 and 195 is an example of what can generally be referred to as a computer program product. The computer program product may include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts described herein.

As indicated above, embodiments of the invention may be implemented in the form of integrated circuits. In a given integrated circuit implementation, identical die are typically formed in a repeated pattern on a surface of a semiconductor wafer. Each die includes scan test circuitry as described herein, and may include other structures or circuits like those described with respect to FIGS. 1-5 that enable the creation of PSROs from pairing scan chain elements in different scan chains during one or more test modes of operation and a functional mode of operation of an integrated circuit. The individual die are cut or diced from the wafer, then packaged as an integrated circuit. One skilled in the art would know how to dice wafers and package die to produce integrated circuits. Integrated circuits with circuit structures described herein that are so manufactured are considered embodiments of this invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A circuit structure, comprising:
a plurality of scan chains each having a plurality of scan chain elements configured to operate as a shift register in a test mode while an integrated circuit undergoes a test mode of operation, and obtain functional data from circuitry in the integrated circuit during a functional mode of operation; and
a scan chain link configured to pair at least one scan chain element from a first scan chain with at least one scan chain element of a second scan chain to form a performance screen ring oscillator (PSRO), wherein the PSRO formed by the scan chain link pairing the at least one scan chain element from the first scan chain with the at least one scan chain element of the second scan chain causes a forward path associated with data flow through the at least one scan chain element of the first scan chain to act as a backward path for data flow through the at least one scan chain element of the second scan chain, and a forward path associated with data flow through the at least one scan chain element of the second scan chain to act as a backward path for data flow through the at least one scan chain element of the first scan chain.

2. The circuit structure according to claim 1, wherein each scan chain element comprises a latch having a data input and a data output.

3. The circuit structure according to claim 2, wherein each scan chain element comprises scan output circuitry coupled to the data output of a corresponding latch in the scan chain element, wherein the scan output circuitry is configured to shift data from the latch to a latch of a following scan chain element in a same scan chain in response to a scan enable signal, and wherein the scan output circuitry is configured to operate in conjunction with the scan chain link to connect with scan output circuitry associated with a scan chain element in a different scan chain in response to a PSRO mode enable signal.

4. The circuit structure according to claim 3, wherein the scan output circuitry comprises two two-input AND gates and a two-input OR gate, the two two-input AND gates each generating an output connecting with the two-input OR gate.

5. The circuit structure according to claim 3, wherein the scan output circuitry comprises a scan output multiplexer having a first selectable input that receives the data output from the latch, a second selectable input that receives a scan data input from a preceding scan chain element in the same scan chain, and a control input configured to receive the scan enable signal.

6. The circuit structure according to claim 3, wherein the scan chain link comprises scan output control circuitry that is configured to control operation of the scan output circuitry of each scan chain element in a scan chain.

7. The circuit structure according to claim 6, wherein the scan output control circuitry is controlled by the data output generated from the latch.

8. The circuit structure according to claim 6, wherein the scan output control circuitry is controlled by the data output generated from a scan chain link control latch.

9. The circuit structure according to claim 6, wherein the scan output control circuitry comprises at least two multiplexers, each multiplexer having a first selectable input that receives a scan data output from a scan chain element in another scan chain, a second selectable input that receives a scan data input from a preceding scan chain element in a scan chain, and a control input configured to receive the data output from a latch.

10. The circuit structure according to claim 3, wherein the scan chain link comprises at least two multiplexers, each multiplexer having a first selectable input that receives a scan data output from a scan chain element in another scan chain, a second selectable input that receives a scan data input from a preceding scan chain element in the scan chain, and a control input configured to receive the PSRO mode enable signal.

11. The circuit structure according to claim 10, wherein the scan chain link comprises at least two two-input AND gates, each coupled to one of the multiplexers, wherein a first input of each two-input AND gate is configured to receive the PSRO mode enable signal and a second input of each two-input AND gate is configured to receive scan data output from a latch in a scan chain.

12. The circuit structure according to claim 10, wherein the scan chain link comprises at least two two-input AND gates, each coupled to one of the multiplexers, wherein a first input of each two-input AND gate is configured to receive the PSRO mode enable signal and a second input of each two-input AND gate is configured to receive scan data output from a scan chain link control latch.

13. The circuit structure according to claim 1, wherein the PSRO operates in only the test mode of operation.

14. The circuit structure according to claim 1, wherein the PSRO operates in both the test mode of operation and the functional mode of operation.

15. A method, comprising:
configuring a scan chain link between a first scan chain having a plurality of scan chain elements and a second scan chain having a plurality of scan chain elements; and
configuring the scan chain link to pair at least one scan chain element from the first scan chain with at least one scan chain element of the second scan chain via the scan chain link to form a performance screen ring oscillator (PSRO), wherein the PSRO formed by the scan chain link pairing the at least one scan chain element from the first scan chain with the at least one scan chain element of the second scan chain causes a forward path associated with data flow through the at least one scan chain element of the first scan chain to act as a backward path for data flow through the at least one scan chain element of the second scan chain, and a forward path associated with data flow through the at least one scan chain element of the second scan chain to act as a backward path for data flow through the at least one scan chain element of the first scan chain.

16. The method according to claim 15, wherein the configuring of the scan chain link to pair at least one scan chain element from the first scan chain with at least one scan chain element of the second scan chain via the scan chain link to form the PSRO is in response to a PSRO mode enable signal applied to the at least one scan chain element from the first scan chain and the at least one scan chain element from the second scan chain.

17. The method according to claim 15, wherein the configuring of the scan chain link to pair at least one scan chain element from the first scan chain with at least one scan chain element of the second scan chain via the scan chain link to form the PSRO is in response to PSRO mode enable signal applied to the scan chain link.

18. The method according to claim 15, further comprising oscillating the PSRO only in a test mode of operation of an integrated circuit.

19. The method according to claim 15, further comprising oscillating the PSRO in both a test mode of operation of an integrated circuit and a functional mode of operation of the integrated circuit.

20. A computer program product comprising a non-transitory computer readable storage medium having a computer program code embodied therein for use in testing an integrated circuit, wherein the computer program code when executed in a testing system performs the actions of the method of claim 15.

* * * * *